(12) United States Patent  
Kakimoto

(10) Patent No.: US 10,438,852 B2
(45) Date of Patent: Oct. 8, 2019

(54) SEMICONDUCTOR DEVICE

(71) Applicant: DENSO CORPORATION, Kariya, Aichi-pref. (JP)

(72) Inventor: Noriyuki Kakimoto, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 15/770,258

(22) PCT Filed: Dec. 16, 2016

(86) PCT No.: PCT/JP2016/087505
§ 371 (c)(1),
(2) Date: Apr. 23, 2018

(87) PCT Pub. No.: WO2017/130597
PCT Pub. Date: Aug. 3, 2017

(65) Prior Publication Data
US 2018/0308757 A1 Oct. 25, 2018

(30) Foreign Application Priority Data

Jan. 27, 2016 (JP) .................................. 2016-013713

(51) Int. Cl.
*H01L 29/00* (2006.01)
*H01L 21/8234* (2006.01)
(Continued)

(52) U.S. Cl.
CPC ...... *H01L 21/823418* (2013.01); *H01L 27/06* (2013.01); *H01L 27/0727* (2013.01);
(Continued)

(58) Field of Classification Search
CPC ........ H02M 1/08; H02M 7/003; H02M 7/538; H02M 7/5375; H01L 27/0727;
(Continued)

(56) References Cited

U.S. PATENT DOCUMENTS 5,828,112 A * 10/1998 Yamaguchi ......... H01L 27/0635
257/378
9,018,985 B2 * 4/2015 Sawada .................. H02M 1/08
327/109
(Continued)

FOREIGN PATENT DOCUMENTS

JP  2009-170670 A  7/2009
JP  2010-263149 A  11/2010
(Continued)

*Primary Examiner* — Mounir S Amer
*Assistant Examiner* — Alexander Belousov
(74) *Attorney, Agent, or Firm* — Posz Law Group, PLC

(57) ABSTRACT

A semiconductor device includes: reverse conducting switching elements-in each of which a diode element and a switching element are arranged in parallel on a single semiconductor substrate; a driver applying a gate voltage to a plurality of gate electrodes in the reverse conducting switching elements; and a mode determination unit determining whether a forward conduction mode in which a current mainly flows through the switching element or a reverse conduction mode in which the current flows through the diode element is being operated.

10 Claims, 8 Drawing Sheets

(51) Int. Cl.

| | |
|---|---|
| *H01L 29/739* | (2006.01) |
| *H01L 29/78* | (2006.01) |
| *H01L 27/06* | (2006.01) |
| *H01L 29/861* | (2006.01) |
| *H01L 29/868* | (2006.01) |
| *H01L 27/088* | (2006.01) |
| *H01L 29/87* | (2006.01) |
| *H02M 1/08* | (2006.01) |
| *H02M 7/00* | (2006.01) |
| *H01L 27/07* | (2006.01) |
| *H01L 29/40* | (2006.01) |
| *H02M 7/538* | (2007.01) |

(52) U.S. Cl.
CPC .......... *H01L 27/088* (2013.01); *H01L 29/739* (2013.01); *H01L 29/78* (2013.01); *H01L 29/861* (2013.01); *H01L 29/868* (2013.01); *H01L 29/87* (2013.01); *H02M 1/08* (2013.01); *H02M 7/003* (2013.01); *H01L 29/407* (2013.01); *H02M 7/538* (2013.01)

(58) Field of Classification Search
CPC ..... H01L 29/861; H01L 29/868; H01L 29/87; H01L 29/407
See application file for complete search history.

(56) References Cited

U.S. PATENT DOCUMENTS

| | | | |
|---|---|---|---|
| 2009/0057832 A1* | 3/2009 | Kouno | H01L 29/7397 257/577 |
| 2011/0001553 A1* | 1/2011 | Soeno | H01L 29/0834 327/534 |
| 2013/0200929 A1* | 8/2013 | Sawada | H02M 1/08 327/109 |
| 2014/0092653 A1* | 4/2014 | Suzuki | H02M 1/08 363/55 |
| 2014/0209972 A1 | 7/2014 | Sumitomo et al. | |
| 2015/0129927 A1 | 5/2015 | Sumitomo et al. | |
| 2016/0056810 A1 | 2/2016 | Kouno | |
| 2016/0247808 A1* | 8/2016 | Horiuchi | H01L 29/78 |
| 2017/0250269 A1 | 8/2017 | Sumitomo et al. | |
| 2018/0241389 A1* | 8/2018 | Nakashima | H02M 1/00 |

FOREIGN PATENT DOCUMENTS

| | | |
|---|---|---|
| JP | 2011-238975 A | 11/2011 |
| JP | 2013-26534 A | 2/2013 |
| JP | 2016-092163 A | 5/2016 |
| JP | 2016-134568 A | 7/2016 |
| JP | 2016-136819 A | 7/2016 |

* cited by examiner

| ACTUAL OPERATION MODE | | OPERATION MODE DETERMINED BY MODE DETERMINATION UNIT | FIRST GATE ELECTRODE | SECOND GATE ELECTRODE |
|---|---|---|---|---|
| A | FORWARD CONDUCTION MODE | FORWARD CONDUCTION MODE | +V1 | +V1 |
| B | | SMALL CURRENT RANGE WHERE OPERATION MODE CANNOT BE DETERMINED | +V1 | −V2 |
| C | REVERSE CONDUCTION MODE | | | |
| D | | REVERSE CONDUCTION MODE | Ve | −V2 |

SEMICONDUCTOR DEVICE

CROSS REFERENCE TO RELATED APPLICATION

This application is a U.S. national stage application of International Application No. PCT/JP2016/087505 filed on Dec. 16, 2016 and is based on Japanese Patent Application No. 2016-13713 filed on Jan. 27, 2016, the disclosures of which are incorporated herein by reference.

TECHNICAL FIELD

The present disclosure relates to a semiconductor device equipped with a switching device and a reverse conducting diode.

BACKGROUND

As described in Patent Literature 1, a semiconductor device having a reverse conducting insulated-gate bipolar transistor (RC-IGBT) is known. In the semiconductor device, a negative voltage is applied to an insulated trench gate electrode when an IGBT device region is switched off and circulating current flows to a diode device region.

The semiconductor device allegedly allows holes flowing out from an anode region to be readily injected to a drift layer along the insulated trench gate electrode, whereby the forward voltage drop (hereinafter, "forward voltage") can be reduced.

PRIOR ART LITERATURES

Patent Literature

Patent Literature 1: JP 2011-238975 A

SUMMARY

To realize the operation described in Patent Literature 1, it is necessary to determine which of the IGBT device region and the diode device region is in the ON state, and to switch the polarities of the gate voltage. In a common inverter circuit for driving a motor, for example, the polarities of the gate voltage would be switched in cycles of the electrical angle of the motor. Which of the IGBT device region and the diode device region is in the ON state can be determined from the polarity of the output current, for example. However, in a configuration where the polarities of the output current switch over in short cycles as in an inverter circuit, there may be a current range where determination of polarities of the output current cannot be made accurately depending on the tolerances of current sensors. Such a current range is a low-current range where the output current is around zero.

For such a current range where polarities of the output current are undeterminable, the conventional practice is to assume that the IGBT device region is in the ON state, in consideration of the operation stability of the entire system. The potential of the gate electrode is fixed to an anode potential in the diode device region of a common RC-IGBT in order to inhibit gate interference in which voltage is applied to the gate electrode. However, the voltage cannot be fixed in a configuration where a negative voltage is applied to the diode device region depending on the polarity of the output current. Therefore, in such a current range where polarities of the output current are undeterminable, a positive voltage would be applied to the gate electrode of the diode device region. Thus, the inventors have found the problem of the risk that the forward voltage may increase in the diode device region.

An object of the present disclosure is to provide a semiconductor device that enables improvement of recovery characteristics and reduction of forward voltage in all current ranges.

A semiconductor device according to an aspect of the present disclosure includes: a reverse conducting switching device including a diode device and a switching device, which are arranged in parallel at a single semiconductor substrate; a driver configured to apply a gate voltage to a plurality of gate electrodes included in the reverse conducting switching device; and a mode determination unit configured to determine whether a forward conduction mode in which a current flows mainly in the switching device, or a reverse conduction mode in which the current flows mainly in the diode device is operated by the reverse conducting switching device. The diode device includes: a first impurity region having a first conduction type; a second impurity region having a second conduction type which is coupled to the first impurity region; a first electrode configured to electrically connected to the first impurity region; a second electrode configured to electrically connected to the second impurity region; a third impurity region having the second conduction type in a current path between the first electrode and the second electrode, the third impurity region arranged to be at the first impurity region and arranged to be isolated from the second impurity region; and an inverted layer generated in a barrier region in the first impurity region between the second impurity region and the third impurity region in response to applying a predetermined gate voltage to the plurality of gate electrodes. The switching device and the diode device share the first electrode and the second electrode, which are in common, and the switching device is turned on to control a current flow between the first electrode and the second electrode in response to applying the predetermined gate voltage to the plurality of gate electrodes. The plurality of gate electrodes includes: a first gate electrode to which a first gate voltage, which is configured to turn on the switching device, is input, and a second gate electrode to which a second gate voltage is input, the second gate voltage being controlled independently of the first gate voltage, the second gate voltage having a potential level same as a potential level at the second electrode or the second gate voltage having a polarity opposite from a polarity of the first gate voltage with reference to the potential level at the second electrode. One part of the plurality of gate electrodes in the diode device includes at least the second gate electrode, and another part of the plurality of gate electrodes in the switching device includes at least the first gate electrode. The second gate voltage is applied to the second gate electrode in response to determining the reverse conducting switching device being operated in the reverse conduction mode based on the current flowing between the first electrode and the second electrode, or in response to the mode determination unit being unable to determine whether the reverse conduction mode or the forward conduction mode is operated by the reverse conducting switching device.

The present disclosure enables reduction of forward voltage in the reverse conduction mode, as well as reduction of forward voltage in the diode device even when it is not determinable whether the operation mode is the reverse conduction mode or the forward conduction mode. When it is not determinable whether the operation mode is the reverse conduction mode or the forward conduction mode, an increase of saturation voltage across the collector and emitter of the IGBT device is limited, since, even if the operation mode is actually the forward conduction mode, the output current of the IGBT device is small enough in a current range where the mode determination is not possible. Thus, adoption of the present invention enables reduction of losses resulting from an increased forward voltage when it is not determinable whether the operation mode is the reverse conduction mode or the forward conduction mode, as compared to conventional counterparts.

BRIEF DESCRIPTION OF DRAWINGS

The above and other objects, features and advantages of the present disclosure will become more apparent from the following detailed description made with reference to the accompanying drawings. In the drawings.

EMBODIMENTS

Figure 1:
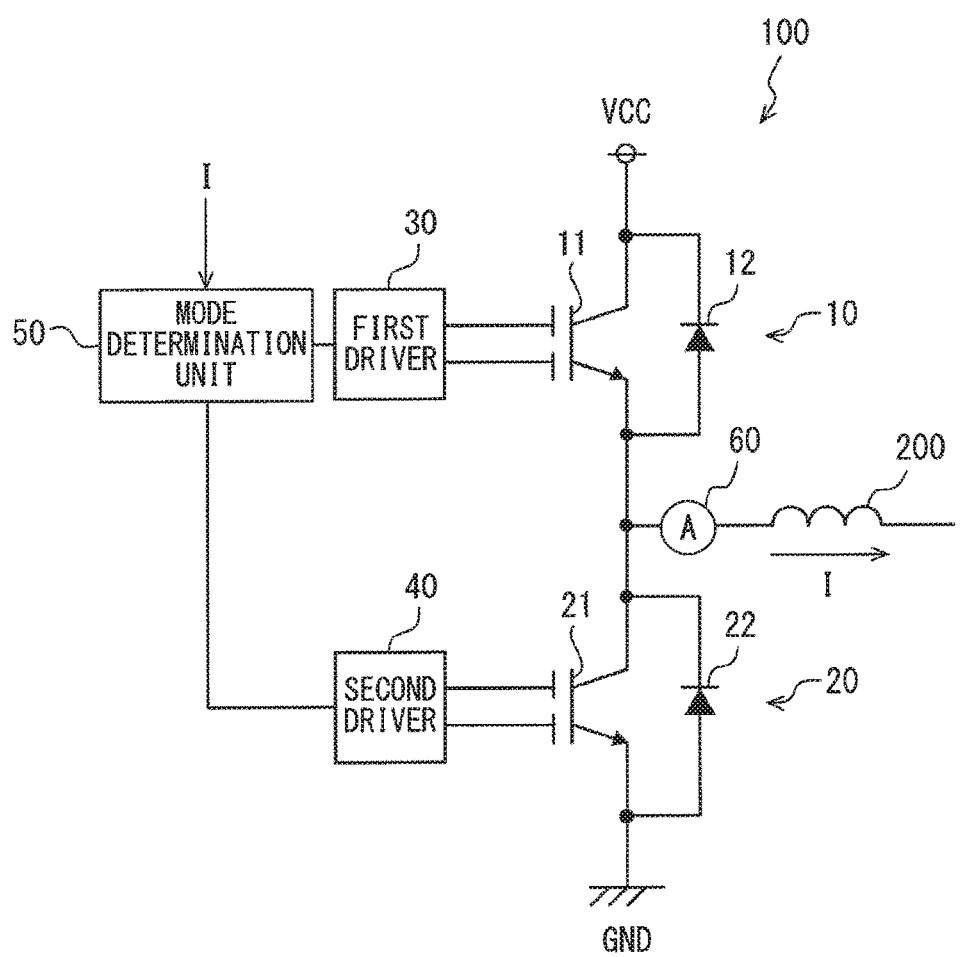
FIG. 1 is a circuit diagram illustrating a schematic configuration of an inverter according to a first embodiment.

Embodiments of the present disclosure will be hereinafter described with reference to the drawings. Same reference numerals are given to components identical or equivalent to each other in different views.

(first Embodiment)

First, the schematic configuration of a semiconductor device according to the present embodiment will be described with reference to FIG. 1.

In the present embodiment, a reverse conducting insulated-gate bipolar transistor (RC-IGBT), having a diode device and an insulated-gate bipolar transistor (IGBT) device on the same semiconductor substrate, will be described.

The RC-IGBT is applied to an inverter, which is a semiconductor device.

As shown in FIG. 1, the inverter 100 includes two reverse conducting insulated-gate bipolar transistors 10 and 20, drivers 30 and 40 for applying gate voltage to gate electrodes of the reverse conducting insulated-gate bipolar transistors 10 and 20, respectively, and a mode determination unit 50 that determines the driving state of each of the reverse conducting insulated-gate bipolar transistors 10 and 20.

As shown in FIG. 1, the inverter 100 is configured to have the two reverse conducting insulated-gate bipolar transistors 10 and 20 connected in series between a power supply voltage VCC and ground GND. A load 200 is connected to a connection point between the two reverse conducting insulated-gate bipolar transistors 10 and 20. In the following description, one of the two reverse conducting insulated-gate bipolar transistors 10 and 20 connected to the load 200 that is closer to the power supply voltage VCC will be referred to as first device 10, while the one that is closer to ground GND will be referred to as second device 20. In other words, the first device 10 configures an upper arm, while the second device 20 configures a lower arm, of the inverter 100. The first device 10 and the second device 20 are equivalent to "reverse conducting switching devices".

The first device 10 includes an IGBT device 11, which is equivalent to a "switching device", and a diode device 12. The diode device 12 is the one known as a freewheeling diode and connected to the IGBT device 11 in parallel so that current flows forward from the emitter to the collector of the IGBT device 11.

The second device 20 is equivalent to the first device 10 and includes an IGBT device 21 and a diode device 22. The diode device 22 is connected to the IGBT device 21 in parallel so that current flows forward from the emitter to the collector of the IGBT device 21.

The first device 10 and the second device 20 are reverse conducting switching devices with a double gate structure, and include two types of gate electrodes. The detailed device structure of the first device 10 and second device 20 will be described later with reference to FIG. 2 and FIG. 3.

The driver includes a first driver 30 that controls application of gate voltage to the first device 10 and a second driver 40 that controls application of gate voltage to the second device 20. The first driver 30 and the second driver 40 have structures equivalent to each other. The drivers 30 and 40 in the present embodiment are each connected to two gate lines as shown in FIG. 1 and configured to apply gate voltage independently to the respective gate electrodes of the first device 10 and second device 20 that have a double gate structure. More specifically, two values of voltage, emitter voltage Ve and +V1, can be input to one gate electrode (first gate electrode 82a to be described later), and three values of voltage, +V1, Ve, and −V2, can be input to the other gate electrode (second gate electrode 82b to be described later). "+V1" refers to a positive voltage relative to the emitter voltage Ve, while "−V2" refers to a negative voltage relative to the emitter voltage Ve.

A "first gate voltage" is equivalent to +V1, and a "second gate voltage" is equivalent to Ve or −V2.

The mode determination unit 50 determines the operation mode of the first device 10 and second device 20. The operation mode is distinguished here by whether current is flowing mainly through the IGBT device, or through the diode device, in the insulated-gate bipolar transistor. In the following description, a state of operation where current flows mainly through the IGBT device will be referred to as forward conduction mode, and a state of operation where current flows mainly through the diode device will be referred to as reverse conduction mode.

The mode determination unit 50 in the present embodiment determines the operation mode of the first device 10 and second device 20 based on the direction of the current flowing through the load 200. The inverter 100 includes a load current detector 60 connected to the load 200 in series. The load current detector 60 is an ammeter that detects a load current I flowing through the load 200 including its direction. The load current detector 60 detects a load current I flowing from the connection point between the first device 10 and the second device 20 to the load 200 as a positive current, and the current flowing reversely as a negative current, and outputs the signal to the mode determination unit 50.

The mode determination unit 50 determines the operation mode based on whether the load current I output from the load current detector 60 is positive or negative. More specifically, if the load current I is positive, it means current is flowing mainly through the IGBT device 11 in the first device 10 (upper arm) and the diode device 22 in the second device 20 (lower arm). Therefore, the mode determination unit 50 determines the operation mode of the first device 10 as forward conduction mode, and the operation mode of the second device 20 as reverse conduction mode. On the other hand, if the load current I is negative, it means current is flowing mainly through the diode device 12 in the first device 10 and the IGBT device 21 in the second device 20. Therefore, the mode determination unit 50 determines the operation mode of the first device 10 as reverse conduction mode, and the operation mode of the second device 20 as forward conduction mode. When the load current I is lower than the level at which the mode determination unit 50 can determine the operation mode, the mode determination unit 50 cannot determine the operation mode of the device 10 or device 20. In this case, the mode determination unit 50 notifies the drivers 30 and 40 that mode determination is impossible.

The mode determination unit 50 notifies the drivers 30 and 40 of the operation mode of the device 10 or 20, or that mode determination is impossible. The drivers 30 and 40 apply gate voltage to the gate electrodes in accordance with the operation mode.

Next, the detailed structure of the first device 10 and second device 20 will be described with reference to FIG. 2. Since the first device 10 and second device 20 are reverse conducting insulated-gate bipolar transistors equivalent to each other, they will be described without being distinguished. Elements common to those in FIG. 1 will be corresponded to the reference numerals given to the first device 10. While the p-type conductivity impurity diffusion layer of the semiconductor substrate 70 is hatched in FIG. 2, the hatching is omitted for the n-type conductivity impurity diffusion layer.

Figure 2:
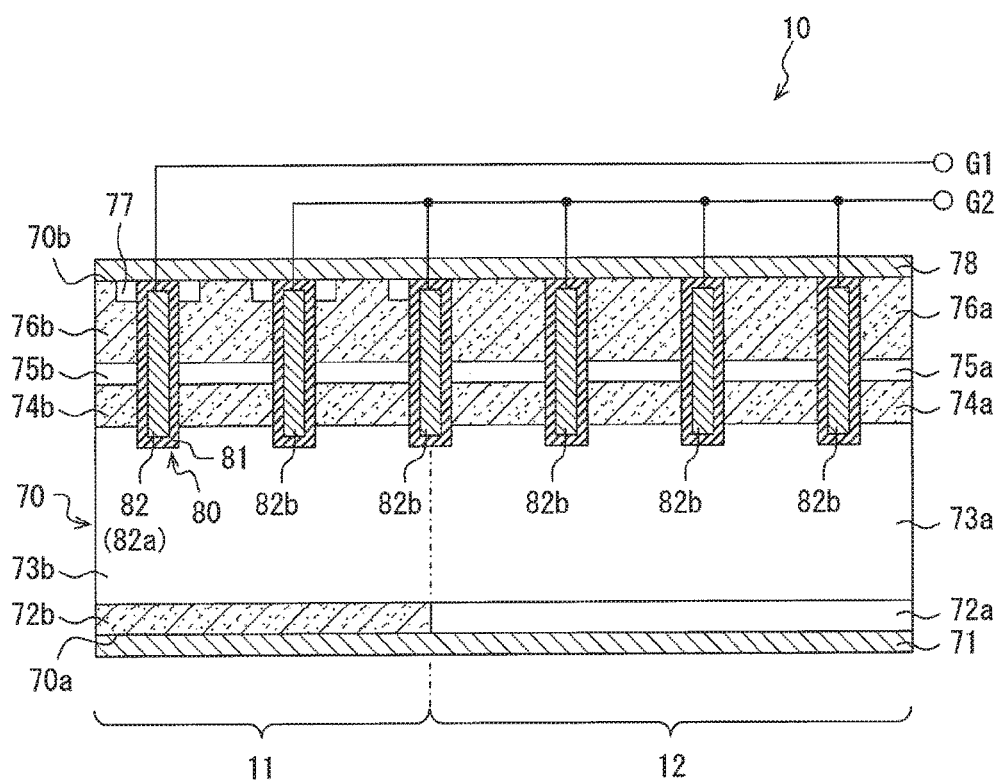
FIG. 2 is a cross-sectional view illustrating the detailed structure of a first or second device in a section along line II-II indicated in FIG. 3.

The reverse conducting insulated-gate bipolar transistor, which is the reverse conducting switching device in the present embodiment, is formed in the semiconductor substrate 70 that has a first main surface 70a and a second main surface 70b that is the back side of the first main surface, as shown in FIG. 2. The IGBT device 11 that provides the function as the switching device and the diode device 12 that provides the function as the diode are formed in the same semiconductor substrate 70.

A cathode electrode 71 made of aluminum, for example, is formed on the first main surface 70a. The cathode electrode 71 corresponds to the cathode terminal of the diode device 12 or the collector terminal of the IGBT device 11. The cathode electrode 71 thus doubles as these terminals. The cathode electrode 71 is equivalent to a "first electrode".

As shown in FIG. 2, a cathode region 72a having an n-type conductivity is formed in contact with the cathode electrode 71 in the surface layer of the first main surface 70a of the semiconductor substrate 70. A collector region 72b having a p-type conductivity is formed in the same layer as the cathode region 72a. The collector region 72b is in contact with the cathode electrode 71 and adjacent the cathode region 72a. The diode device 12 can act as IGBT 11 near the interface between the IGBT device 11 and the diode device 12. There, the IGBT device 11 can act as diode device 12. In the present embodiment, the region where the functions of the IGBT device 11 and diode device 12 exist is referred to as "combined region", and the interface between the cathode region 72a and the collector region 72b is referred to as the interface between the diode portion 12 and the IGBT portion 11. The cathode region 72a is equivalent to part of a "first impurity region".

A first drift region 73a having an n-type conductivity is formed on the cathode region 72a, and a second drift region 73b having an n-type conductivity is formed on the collector region 72b. While the first drift region 73a and the second drift region 73b are named separately for convenience of description, these regions 73a and 73b are one continuous region of substantially the same impurity diffusion layer. The first drift region 73a is equivalent to part of the "first impurity region".

A first sub anode 74a having a p-type conductivity is formed on the first drift region 73a, and a second sub anode 74b having a p-type conductivity is formed on the second drift region 73b. While the first sub anode 74a and the second sub anode 74b are named separately for convenience of description, these sub anodes 74a and 74b are one continuous region of substantially the same impurity diffusion layer. The first sub anode region 74a and the second sub anode region 74b are equivalent to a "third impurity region".

A first barrier region 75a having an n-type conductivity is formed on the first sub anode 74a, and a second barrier region 75b having an n-type conductivity is formed on the second sub anode 74b. While the first barrier region 75a and the second barrier region 75b are named separately for convenience of description, these barrier regions 75a and 75b are one continuous region of substantially the same impurity diffusion layer. The first barrier region 75a is equivalent to part of the "first impurity region".

A anode region 76a having a p-type conductivity is formed on the first barrier region 75a, and a body region 76b having a p-type conductivity is formed on the second barrier region 75b. While the anode region 76a and the body region 76b are named separately for convenience of description, these regions 76a and 76b of the present embodiment are one continuous region of substantially the same impurity diffusion layer. The anode region 76a is equivalent to part of a "second impurity region".

The first impurity region refers to an n-type conductivity region including the cathode region 72a, the first drift region 73a, and the first barrier region 75a. The diode device 12 is configured such that the first sub anode 74a is embedded in the first impurity region while being separated from the anode region 76a that is the second impurity region. The first sub anode 74a is formed in a current path through which current flows between the first drift region 73a and the anode region 76a.

Due to the first sub anode 74a and the first barrier region 75a in the diode device 12, injection of holes from the anode region 76a to the first drift region 73a is restricted, which limits the reverse current that flows when the voltage applied to the diode device 12 is switched from forward bias to reverse bias. As compared to diodes without the first sub anode 74a and first barrier region 75a, the reverse recovery current is made smaller, and thus the recovery characteristics can be improved. On the other hand, the forward voltage VF is increased because the p-n junction formed by the first sub anode 74a and first barrier region 75a inhibits the forward current flow of the diode device 12.

Emitter regions 77 each having an n-type conductivity are formed so as to be surrounded by the body region 76b in the surface layer of the second main surface 70b. An anode electrode 78 is formed on the second main surface 70b so as to be in contact with the emitter regions 77, body region 76b, and anode region 76a. The anode electrode 78 is equivalent to the anode terminal of the diode device 12 or the emitter terminal of the IGBT device 11. The anode electrode 78 is equivalent to a "second electrode".

As shown in FIG. 2, the IGBT device 11 includes the collector region 72b, the second drift region 73b, the second sub anode 74b, the second barrier region 75b, the body region 76b, and the emitter regions 77 as the impurity diffusion layer. The diode device 12 includes the cathode region 72a, the first drift region 73a, the first sub anode 74a, the first barrier region 75a, and the anode region 76a as the impurity diffusion layer.

While the impurity diffusion layers are each located in substantially the same layers, this is not exclude layers having different impurity concentrations for various regions in accordance with the requirements determined by the electrical characteristics of the IGBT device 11 and diode device 12, and the impurity concentrations of these regions should be set suitably.

This reverse conducting insulated-gate bipolar transistor further includes trench gates 80 formed to extend from the second main surface 70b in the thickness direction of the semiconductor substrate 70 as far as to reach the drift regions 73a and 73b. The trench gates 80 in the IGBT device 11 extend through the body region 76b, the second barrier region 75b, and the second sub anode 74b, and reach the second drift region 73b. The trench gates in the diode device 12 extend through the anode region 76a, the first barrier region 75a, and the first sub anode 74a, and reach the first drift region 73a.

The trench gate 80 includes an insulating film 81 deposited on the inner surface of a trench formed into the second main surface 70b to extend in the thickness direction of the semiconductor substrate 70 as far as to reach the drift regions 73a and 73b, and a conductive gate electrode 82 formed so as to fill the trench. The gate electrodes 82 and the emitter electrode 78 are insulated from each other by the insulating film 81. The emitter regions 77 in the IGBT device 11 are formed so as to be in contact with the trench gates 80, and when a voltage higher than that of the anode electrode 78 is applied to the gate electrodes 82, a channel is formed in the body region 76b and the second sub anode 74b, whereby an output current flows across the anode electrode 78 and the cathode electrode 71 by the IGBT operation.

The plurality of gate electrodes 82 in the present embodiment are classified into two types, first gate electrodes 82a and second gate electrodes 82b. The first gate electrodes 82a are connected to a first gate pad G1. The second gate electrodes 82b are connected to a second gate pad G2. Voltage is applied independently to each of the first gate electrodes 82a and the second gate electrodes 82b. The first driver 30 supplies voltage to the first gate electrodes 82a and the second gate electrodes 82b of the first device 11 as shown in FIG. 1. Similarly, the second driver 40 supplies voltage to the first gate electrodes 82a and second gate electrodes 82b of the second device 21.

Here, a pnp-type parasitic transistor is formed by the anode region 76a having a p-type conductivity and the body region 76b, the first and second barrier regions 75a and 75b having a n-type conductivity, and the first and second sub anodes 74a and 74b having a p-type conductivity. While barrier regions 75a and 75b each having a n-type conductivity are potential barriers for the holes in the p-type conductivity regions, the barrier height can be controlled by the voltage applied to the gate electrodes 82 (gate voltage).

As already described above, the voltage applied to the second gate electrodes 82b in particular is lower by V2 than the voltage of the anode electrode 78 (which is equivalent to the "second electrode" and is referred to as "emitter electrode" in the IGBT). In other words, the potential of the second gate electrodes 82b can be made negative relative to the anode electrode 78. This allows the potential barrier height of the barrier regions 75a and 75b to be varied such that there are no potential barriers. Thus, the first barrier region 75a of the diode device 11 is inverted, so that the anode region 76a, the first barrier region 75a, and the first sub anode 74a can be regarded as one integral p-type conductivity region. This means that the diode device 12 becomes a simple p-n junction diode, so that the forward voltage VF can be reduced as compared to diodes that have the first sub anode 74a.

In the present embodiment, the gate voltage V2 is set to a value that can at least create a channel in the first barrier region 75a. In other words, the voltage V2 in the diode device 12 is set equal to or higher than the threshold voltage Vth of the parasitic transistor formed by the anode region 76a, the first barrier region 75a, and the first sub anode 74a. On the other hand, the gate voltage V1 is set to a value that can at least create a channel in the body region 76b of the IGBT device 11. In other words, the gate voltage V1 is set so as to turn on the IGBT that is a switching device.

The n-type and p-type conductivities in the present embodiment are respectively equivalent to a "first conduction type" and a "second conduction type". The relationship between the two conductivity types may be inverted. In that case, the relationship between the anode and cathode will be inverted, too.

Next, the planar layout of the first device 10 and second device 20 will be described with reference to FIG. 3. Since the first device 10 and the second device 20 are reverse conducting insulated-gate bipolar transistors equivalent to each other, they will be described without being distinguished. Elements common to those in FIG. 1 and FIG. 2 will be corresponded to the reference numerals given to the first device 10. The cross section along the line II-II in FIG. 3 corresponds to FIG. 2.

Figure 3:
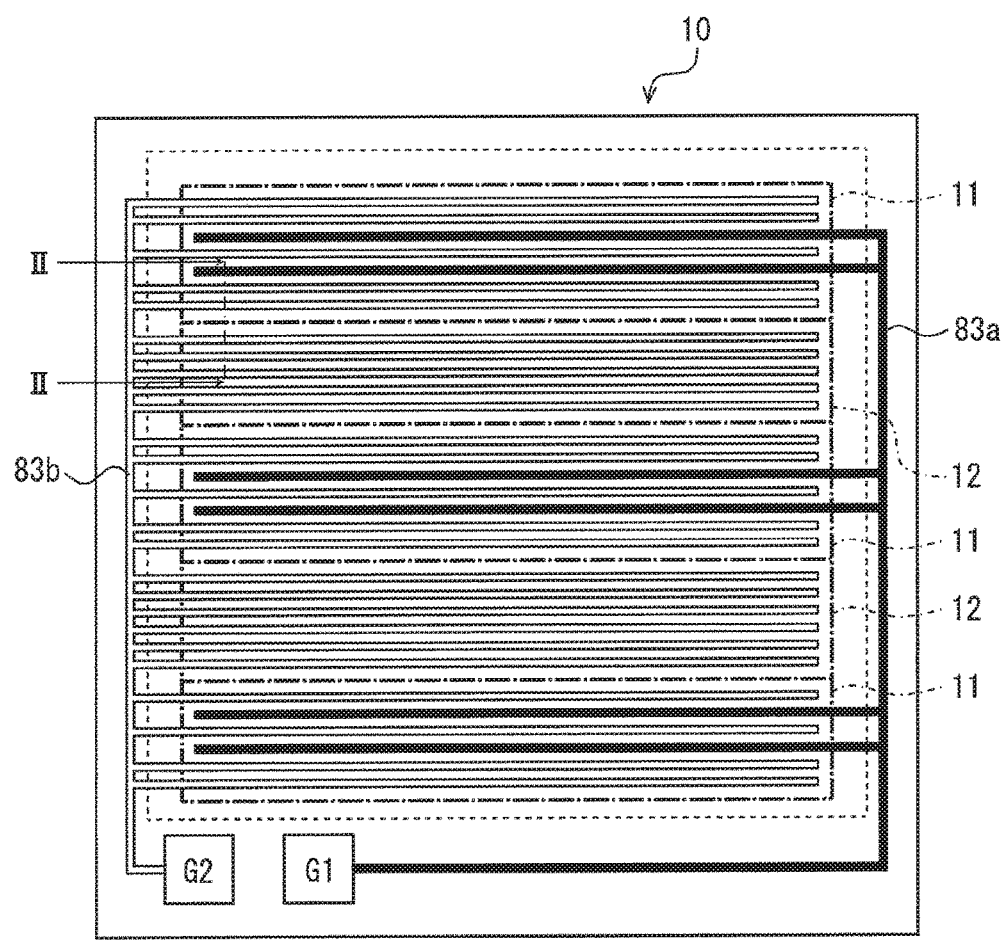
FIG. 3 is a top plan view illustrating the detailed structure of the first or second device.

As shown in FIG. 3, the insulated-gate bipolar transistor of the present embodiment has gate electrodes 82 in stripes. Gate lines 83 that electrically connect the gate pads G1 and G2 with the gate electrodes 82 are formed along the direction in which the gate electrodes 82 extend on the device regions where the IGBT device 11 or the diode device 12 is formed. The gate lines 83 include a first gate line 83a that connects the first gate pad G1 with the first gate electrodes 82a, and a second gate line 83b that connects the second gate pad G2 with the second gate electrodes 82b.

As mentioned above, the potential Ve of the anode electrode 78 (i.e., emitter electrode), and a positive voltage +V1 relative to Ve can be applied to the first gate electrodes 82a. Ve, +V1, and a negative voltage −V2 relative to Ve can be applied to the second gate electrodes 82b.

In this insulated-gate bipolar transistor, the gate electrodes 82 of the IGBT device 11 include both of the first gate electrodes 82a and the second gate electrodes 82b. Only the second gate electrodes 82b are assigned to the diode device 12 as the gate electrodes 82. Namely, in addition to at least the gate voltage V1 that turns on the IGBT, another gate voltage −V2 can be applied to the IGBT device 11 independently of the application of the gate voltage V1. At least the gate voltage −V2 can be applied to the diode device 12.

As shown in FIG. 3, the second gate electrodes 82b are assigned to the region near the boundary of the IGBT device 11 and diode device 12, i.e., the combined region. Namely, both +V1 and −V2 can be applied to the combined region.

In the region where the IGBT device 11 is formed, the first gate electrodes 82a and the second gate electrodes 82b are preferably arranged alternately in the direction orthogonal to the extending direction of the gate lines 83 as shown in FIG. 3. The gate electrodes 82 of the same type can of course be arranged adjacent each other. By arranging the first gate electrodes 82a and the second gate electrodes 82b alternately, the switching speed associated with turn-off, which will be described later in more detail, can be increased more effectively. It is also thermally advantageous since heat generating sources can be dispersed.

Not all the gate electrodes 82 may necessarily be assigned as the first gate electrode 82a or second gate electrode 82b. The gate electrodes 82 may be thinned out by short-circuiting some of the gate electrodes to the anode electrode 78. The potential of the gate electrodes 82 short-circuited to the anode electrode 78 is fixed to the anode voltage (equivalent to the emitter voltage), so that the overall gate capacitance of both devices 10 and 20 can be reduced. This can reduce the required drive capability of the drivers 30 and 40 that drive the devices 10 and 20.

Figures 4, 5:
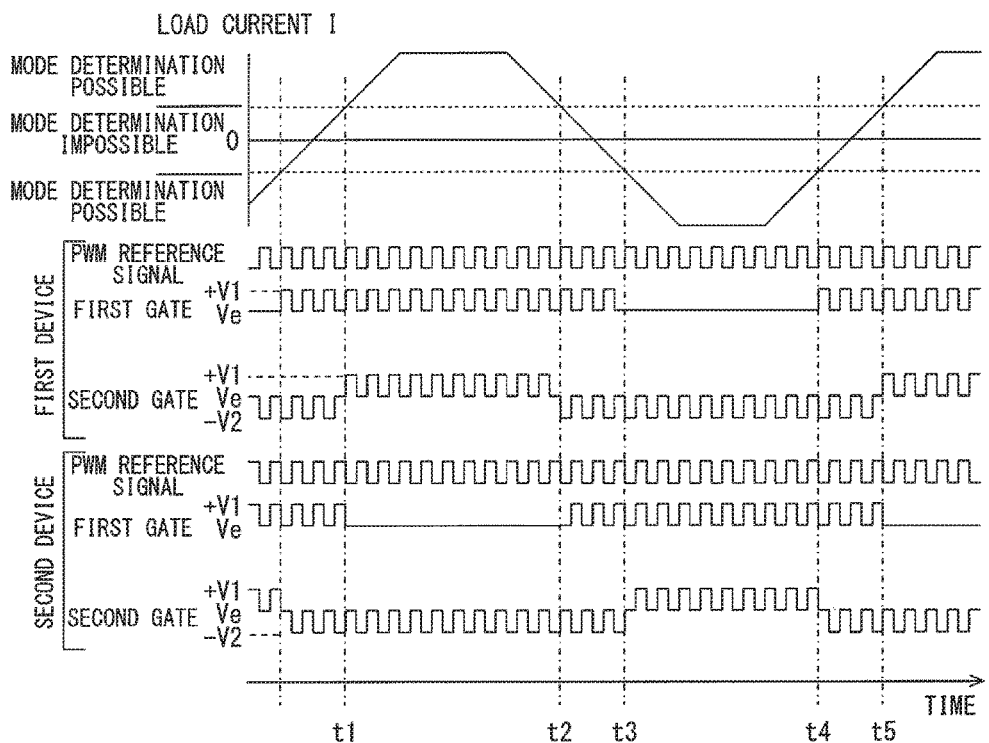
FIG. 4 is a diagram showing application patterns of gate voltage applied by a driver to the first or second device.
FIG. 5 is a timing chart showing the timing of applying gate voltage.

Next, the operation and effects of the semiconductor device, in particular the first device 10 and the second device 20 of the present embodiment will be described with reference to FIG. 4. FIG. 4 illustrates gate voltage applied to the first gate electrodes 82a and the second gate electrodes 82b in correspondence with the operation modes of the first device 10 and second device 20. Since the first device 10 and the second device 20 are equivalent to each other, the first device 10 only will be described unless otherwise stated.

There are four states, A to D, shown in FIG. 4, of the device 10. In state A, the load current I is large enough so that the mode determination unit 50 can determines that the device is operating in the forward conduction mode. In state B, the load current I is too small to determine the operation mode so that, while the operation mode is actually the forward conduction mode, the mode determination unit 50 cannot determine whether it is the forward conduction mode or the reverse conduction mode. In state C, the load current I is too small to determine the operation mode so that, while the operation mode is actually the reverse conduction mode, the mode determination unit 50 cannot determine whether it is the forward conduction mode or the reverse conduction mode. In state D, the load current I is large enough so that the mode determination unit 50 can determine that the device is operating in the reverse conduction mode.

In state A, the driver 30 applies voltage +V1 to both of the first gate electrodes 82a and the second gate electrodes 82b. Since the device 10 is driving in the forward conduction mode in state A, the device is expected to function as an IGBT. Therefore, the device can be made to operate as an IGBT by applying voltage +V1 to both of the first gate electrodes 82a and the second gate electrodes 82b that are present in the region where the IGBT device 11 is formed. Voltage +V1 is also applied to the second gate electrodes 82b present in the region where the diode device 12 is formed. The gate electrodes 82 belonging to the diode device 12 are all second gate electrodes 82b in the present embodiment, so that voltage +V1 is applied also to the combined region near the boundary with the IGBT device 11. Thus the combined region can be made to function as an IGBT.

In state B and state C, the driver 30 applies voltage +V1 to the first gate electrodes 82a, and voltage −V2 to the second gate electrodes 82b. In state B and state C, the amount of current is in the range where the mode determination unit 50 cannot determine which operation mode the device 10 is operating in. Assuming that the device 10 is operating in the forward conduction mode (state B), the IGBT device 11 can be made to operate correctly as an IGBT since voltage +V1 is applied to the first gate electrodes 82a belonging to the IGBT device 11. Since voltage −V2 is applied to the second gate electrodes 82b belonging to the IGBT device 11, holes can readily flow into the body region 76b when the IGBT device 11 is turned off. That is, the holes present in the second drift region 73b can readily move to the body region 76b, so that the switching speed associated with turn-off can be made faster.

On the other hand, even if the device 10 is operating in the reverse conduction mode (state C), the effect of reducing forward voltage VF can be achieved, since voltage −V2 is applied to the second gate electrodes 82b belonging to the diode device 12. While voltage +V1 is being applied to the first gate electrodes 82a to make the IGBT device 11 operate as an IGBT as mentioned above, voltage −V2 is also applied to the combined region near the boundary between the IGBT device 11 and the diode device 12 by the presence of the second gate electrodes 82b. Therefore, gate interference caused by application of voltage +V1 to the first gate electrodes 82a can be inhibited. Namely, the diode device 12 can reliably be made to function as a diode.

In state D, the driver 30 applies emitter voltage Ve to the first gate electrodes 82b, and voltage −V2 to the second gate electrodes 82b. Since the device 10 is driving in the reverse conduction mode in state D, the device is expected to function as a diode. Therefore, the effect of reducing forward voltage VF can be achieved by applying voltage −V2 to the second gate electrodes 82b that are present in the region where the diode device 12 is formed. Meanwhile, the emitter voltage Ve is being applied to the first gate electrodes 82a. Therefore, a negative voltage need only be applied to the second gate electrodes 82b, as compared to when a negative voltage relative to emitter voltage Ve is applied to the first gate electrodes 82a, so that the circuit scale can be made smaller.

Next, three specific examples of timings of applying gate voltage −V2 to the second gate electrodes 82b will be described with reference to FIG. 5 to FIG. 7. The load current I in FIG. 5 to FIG. 7 bears the same meaning as the load current I shown in FIG. 1. The load current I is a positive current when it flows from the connection point between the first device 10 and the second device 20 toward the load 200. The gate voltage applied to the first gate electrodes 82a is for making the IGBT device 11 operate as an IGBT and alternating between a high level and a low level in sync with a PWM reference signal.

<Example of Voltage Application Synchronized with PWM Reference Signal>

In this example, as shown in FIG. 5, the gate voltage applied to the second gate electrodes 82b is also synchronized with the PWM reference signal as with the voltage to the first gate electrodes 82a. The high and low levels of the PWM reference signal for the first device 10 that forms the upper arm and for the second device 20 that forms the lower arm are inverted from each other. The gate voltages shown in FIG. 4 become effective during the high level period of the PWM reference signal, while emitter voltage Ve is applied to each gate electrode 82 as gate voltage during the low level period of the PWM reference signal.

From time t1 to time t2, the mode determination unit 50 determines that the first device 10 is in the forward conduction mode and the second device 20 is in the reverse conduction mode. Thus, the first device 10 operates in state A. Namely, PWM-controlled gate voltage is applied to both of the first gate electrodes 82a and second gate electrodes 82b. In the PWM-controlled gate voltage, the high level and low level alternating in sync with the PWM reference signal are +V1 and Ve, respectively. Meanwhile, the second device 20 operates in state D. Namely, while emitter voltage Ve is always applied to the first gate electrodes 82a, PWM-controlled gate voltage is applied to the second gate electrodes 82b. In the PWM-controlled gate voltage, the high level and low level are Ve and −V2, respectively.

From time t2 to time t3, the mode determination unit 50 cannot determine the operation mode of the first device 10 and second device 20. It means the first device 10 and the second device 20 operate in state B or state C. Namely, PWM-controlled gate voltage is applied to the first gate electrodes 82a. In the PWM-controlled gate voltage, the high level and low level are +V1 and Ve, respectively. PWM-controlled gate voltage is applied to the second gate electrodes 82b. In the PWM-controlled gate voltage, the high level and low level are Ve and −V2, respectively.

From time t3 to time t4, the mode determination unit 50 determines that the first device 10 is in the reverse conduction mode and the second device 20 is in the forward conduction mode. It means the first device 10 operates in state D and second device 20 operates in state A. The high-low relationships of gate voltage are inverted from those of the first device 10 and second device 20 from time t1 to time t2.

From time t4 to time t5, the mode determination unit 50 cannot determine the operation mode of the first device 10 and second device 20. It means the first device 10 and the second device 20 operate in state B or state C. Namely, the gate voltage changes similarly to the changes from t2 to t3.

In this example, in the reverse conduction mode of state C or state D, forward voltage VF can be reduced, because a negative voltage −V2 relative to the emitter voltage Ve is applied to the diode device 12. In addition, as practiced in common driver circuits, a certain length of dead time when voltage to both devices is low level is given, so that the PWM reference signal input to the first device 10 and the PWM reference signal input to the second device 20 do not become high level at the same time. This allows the gate voltage applied to the diode device 12 during the recovery period of the reverse conducting insulated-gate bipolar transistor to be maintained at Ve, so that, as compared to when always −V2 is applied, the recovery loss can be reduced.

<Example where Always Negative Voltage is Applied>

Figure 6:
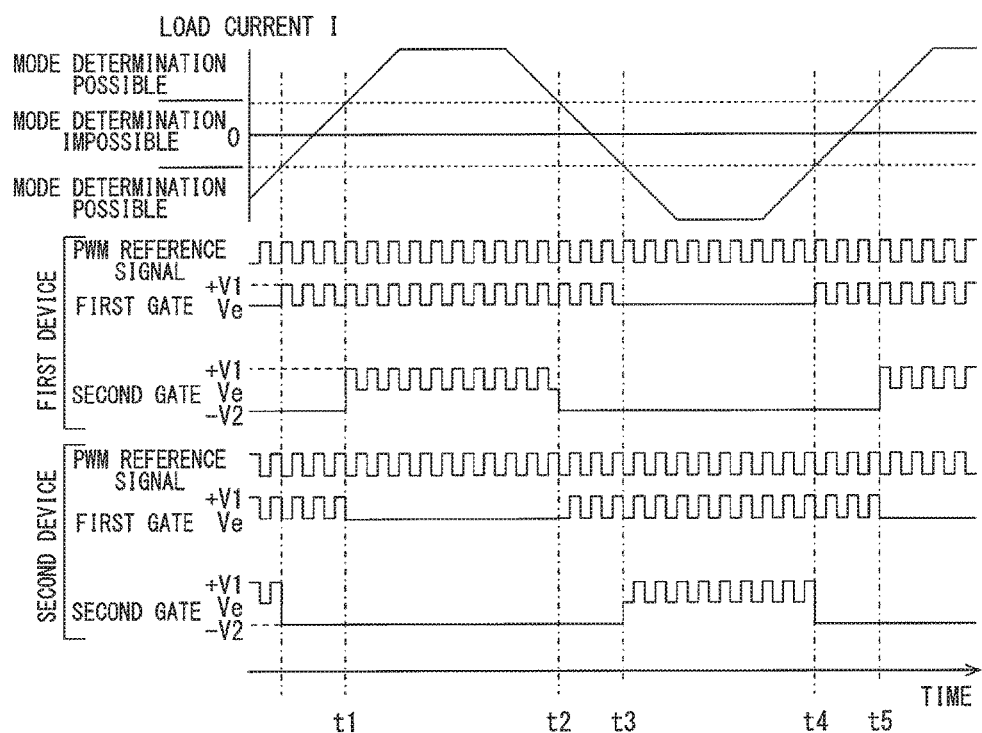
FIG. 6 is a timing chart showing the timing of applying gate voltage.
Figure 7:
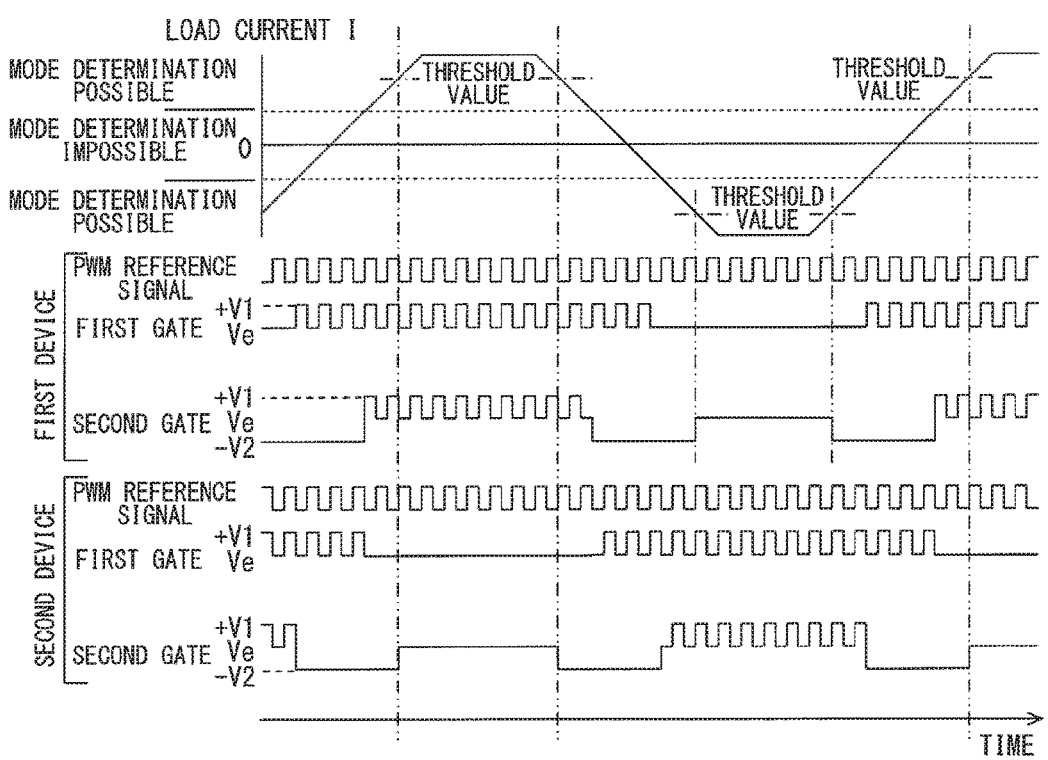
FIG. 7 is a timing chart showing the timing of applying gate voltage.

In this example, as shown in FIG. 6, when the gate voltage applied to the second gate electrodes 82b in state B to state D is −V2, the voltage −V2 is always applied irrespective of the PWM reference signal. In this example, too, forward voltage VF can be reduced, because a negative voltage −V2 relative to the emitter voltage Ve is applied to the diode device 12. Since a condition is created where holes can easily flow into the body region 76b in the IGBT device 11, the switching speed associated with turn-off can be made faster. As compared to the operation where voltage application is synchronized with the PWM reference signal described above, the level of V2 is preferably set lower. This is because, if V2 is set too high, the recovery loss in the diode device 12 will increase, when a large diode current flows due to reverse conduction. While losses caused by forward voltage VF can be reduced more effectively in such an example where voltage −V2 is always applied irrespective of the PWM reference signal, there is also a possibility that the recovery losses will increase too. Therefore, this scheme is effective in systems where the ratio of losses caused by forward voltage VF to the drive losses of the entire system is high.

<Example where Negative Voltage is Applied Depending on the Amount of Diode Current>

With a voltage application scheme where −V2 is always applied irrespective of the PWM reference signal, there is a possibility that the recovery losses will increase too when there is a large diode current, as described above. To solve this, in this example, as shown in FIG. 7, a threshold is set to the diode current, and to the load current I. When the load current I is smaller than the threshold, voltage −V2 is applied to the second gate electrodes 82b, while, when the load current I is larger than the threshold, voltage Ve is applied to the second gate electrodes 82b. This way, recovery losses when there is a large diode current can be reduced.

<Second Embodiment>

Figure 8:
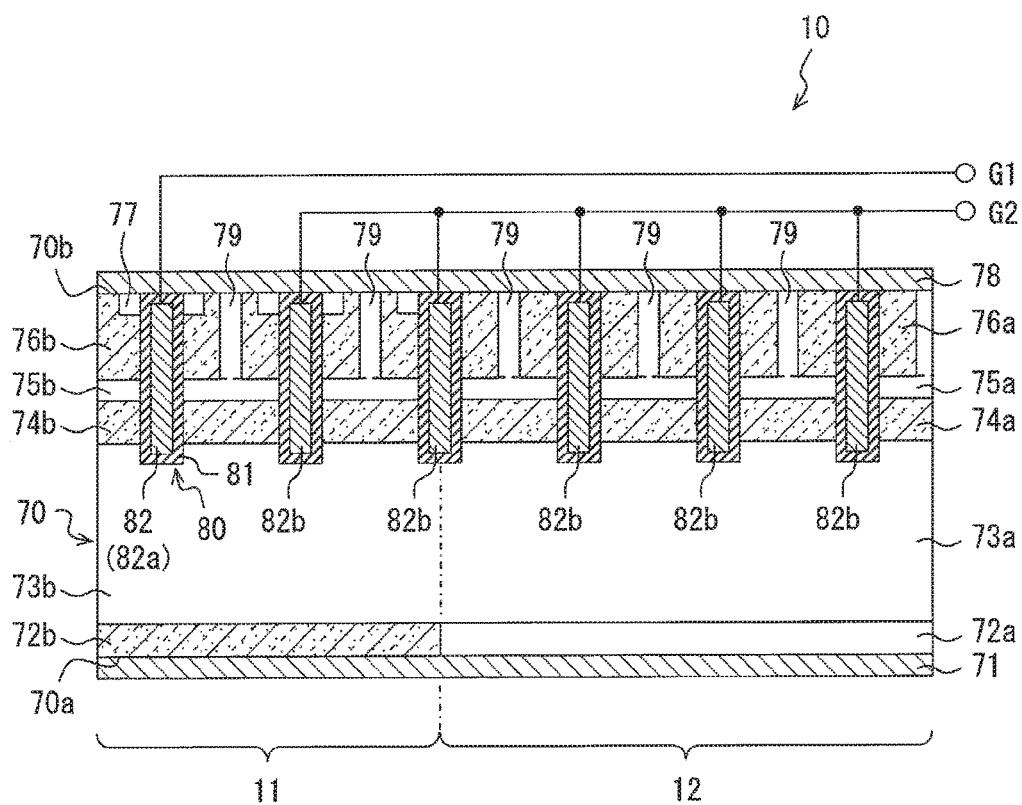
FIG. 8 is a cross-sectional view illustrating the detailed structure of a first or second device according to a second embodiment.

In addition to the reverse conducting insulated-gate bipolar transistors that are the first device 10 and second device 20 described in the first embodiment, there is preferably also pillar regions 79 having n-type conductivities as shown in FIG. 8. The pillar regions 79 are formed so as to extend from the second main surface 70b of the semiconductor substrate 70 in the thickness direction, through the anode region 76a or body region 76b, and to reach the first barrier region 75a and second barrier region 75b. The pillar regions 79 are a diffusion layer where impurities of the same conduction type as that of the first and second barrier regions 75a and 75b are doped. Thus the pillar regions 79 and barrier regions 75a and 75b have substantially the same potential.

With the pillar regions 79 provided, when forward bias is applied across the anode electrode 78 and the cathode electrode 71, the anode electrode 78 is short-circuited to the pillar regions 79 via the metal-semiconductor joint surface. Since the pillar regions 79 and the first barrier region 75a have substantially the same potential, the potential difference between the first barrier region 75a and the anode electrode 78 is substantially equal to a voltage drop at the metal-semiconductor joint surface. Since the voltage drop at the metal-semiconductor joint surface is smaller than the built-in voltage of the p-n junction between the anode region 76a and the first barrier region 75a, hole injection from the anode region 76a to the first drift region 73a is inhibited.

When the voltage across the anode electrode 78 and the cathode electrode 71 is switched from forward bias to reverse bias, the recovery current in the diode device 12 is small and recovery time is short, since the hole injection from the anode region 76a to the first drift region 73a is inhibited at the time of applying the forward bias.

In this diode device 12, when reverse bias is applied across the anode electrode 78 and the cathode electrode 71, the depletion layer extending from the interface of the p-n joint between the first sub anode 74a and the first drift region 73a ensures that a certain withstand voltage is achieved. That is, this diode device 12 can have an enhanced withstand voltage against reverse bias.

While the pillar regions 79 are formed also in the IGBT device 11 in the example of the present embodiment, they may be formed at least in the diode device 12 so as to achieve the effect of inhibiting hole injection. Therefore, the pillar regions 79 need not necessarily be formed in the IGBT device 11.

<Third Embodiment>

Figure 9:
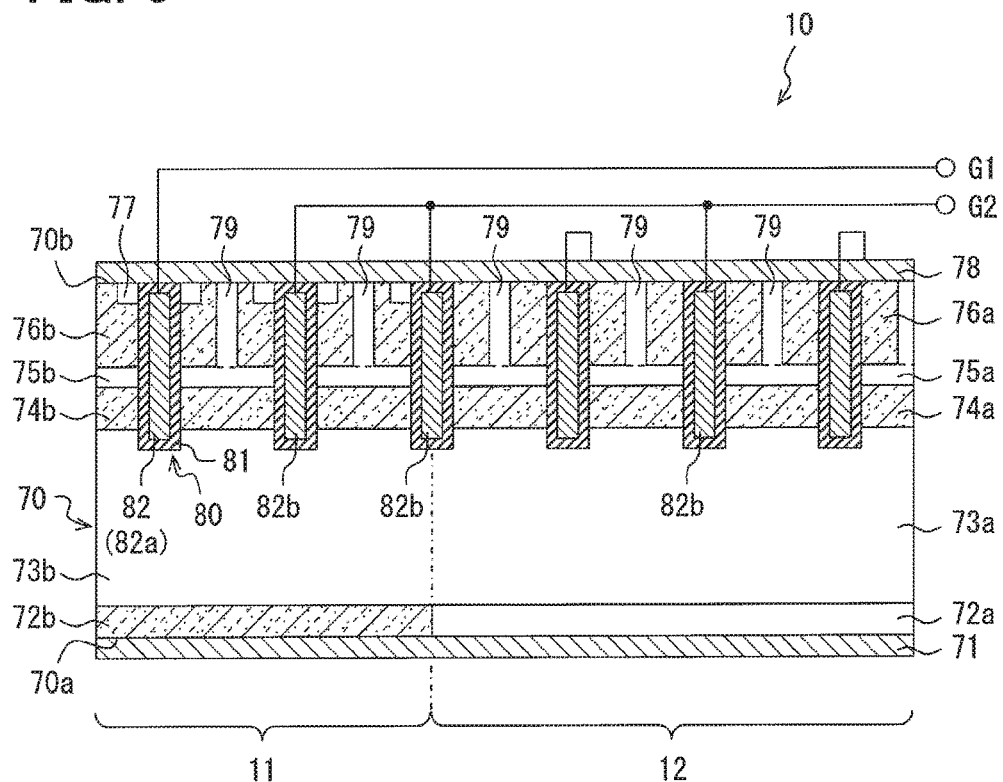
FIG. 9 is a cross-sectional view illustrating the detailed structure of a first or second device according to a third embodiment.

The thinned-out structure mentioned in the description of the planar layout with reference to FIG. 3 in the first embodiment will be described more specifically in the present embodiment. The present embodiment adopts the aspect with pillar regions 79 described in the second embodiment. As shown in FIG. 9, the gate electrodes 82 adjacent each other are not short-circuited to the anode electrodes 78 in the diode device 12. In other words, gate electrodes 82 adjacent the gate electrodes 82 short-circuited to the anode electrodes 78 are assigned as the second gate electrodes 82b. The first barrier regions 75a formed in the diode device 12 are in contact with at least one second gate electrode 82b via the insulating film 81, so that the diode device 12 can provide the effect of reducing the forward voltage VF by application of the negative voltage −V2 to the second gate electrodes 82b. Also, the effect of reducing the gate capacitance by the thinned-out structure can be achieved.

While the reverse conducting insulated-gate bipolar transistor of the present embodiment described above includes pillar regions 79, the same applies to the structure that does not have pillar regions 79 as with the first embodiment.

<Other Embodiments>

While preferred embodiments of the present disclosure have been described above, the present disclosure is not limited to the embodiments described above in any way, and can be embodied with various modifications without departing from the scope of the subject matter of the present disclosure.

Figure 10:
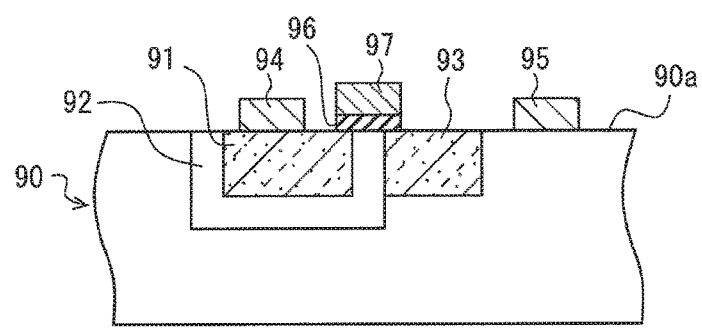
FIG. 10 is a cross-sectional view illustrating the structure of a lateral diode.

While vertical insulated-gate bipolar transistors having trench gates 80 have been described above as examples in the various embodiments, the device need not necessarily include trench gate electrodes 82, and need not necessarily be a vertical type. The present disclosure is also applicable to lateral devices as shown in FIG. 10. In the diode having a barrier region and a gate electrode, a anode region 91 having a p-type conductivity is formed in the surface layer of one surface 90a of the semiconductor substrate 90 having an n-type conductivity as shown in FIG. 10. A barrier region 92 having an n-type conductivity is formed so as to surround the anode region 91 and to be partly exposed on the one surface 90a. A sub anode 93 is formed on the opposite side from the anode region 91 across the barrier region 92. An anode electrode 94 made of metal is joined on the one surface 90a of the anode region 91. A cathode electrode 95 is joined to the one surface 90a of the semiconductor substrate 90 where the anode region 91, the barrier region 92, and the sub anode 93 are not formed.

The diode current flows across the anode electrode 94 and the cathode electrode 95. In this example, the n-type semiconductor substrate where the cathode electrode 95 is joined is equivalent to the "first impurity region", and the anode region 91 where the anode electrode 94 is joined is equivalent to the "second impurity region". Namely, the diode current flows across a semiconductor substrate near the cathode electrode 95 and the anode region 91, with the sub anode 93 and the barrier region 92 being positioned in this current path. Further, a gate electrode 97 is formed on the one surface 90a where the barrier region 92 is exposed, via an insulating film 96. Similarly to the vertical diode device 12 described in the first embodiment, with the barrier region 92, the recovery characteristics can be improved in the lateral diode, too, and the forward voltage VF can be reduced by applying a negative voltage relative to the potential of the anode region 91 to the gate electrode 97. Thus, similarly to the first embodiment, when the mode determination unit 50 cannot determine whether the mode is the forward conduction mode or reverse conduction mode, the same effects as those of the first embodiment can be achieved by applying a negative voltage to the gate electrode 97.

In each of the embodiments described above, only the emitter voltage Ve may be applied at the timing when negative voltage −V2 is to be input. In this case, the effect of reducing the forward voltage VF by application of negative voltage will be smaller. On the other hand, since voltage +V1 is not applied to the diode device 12, deterioration of diode characteristics, in particular an increase of the forward voltage VF resulting from the application of +V1, can be prevented.

While the IGBT device 11 is adopted as the switching device arranged side by side with the diode device 12 in each of the embodiments described above, the switching device may be a MOSFET, for example. In the case with a MOSFET, the collector region 72b in the switching device region shown in FIG. 2, FIG. 8, and FIG. 9 (IGBT device 11 in the embodiments described above) will be a drain region having an n-type conductivity that doubles both as the switching device and the diode device. Namely, the switching device region and the diode device 12 need not be separately prepared. The emitter region 77 shown in FIG. 2, FIG. 8, and FIG. 9 will be a source region. In such an aspect, a region that functions substantially as a switching device and a region that functions substantially as a diode will be formed side by side.

While the gate electrodes 82 are formed in stripes as one example in the embodiments described above, the gate electrodes 82 may be formed in any shape such as grids, for example, as long as first gate electrodes 82a and second gate electrodes 82b are separated.

Barrier regions 92 and sub anodes 93 need not necessarily be formed in the IGBT device 11 or 21 in the reverse conducting switching device. The sub anodes 93 may be formed only partly and not entirely in the diode device 12 or 22.

In the embodiments described above, the first electrodes and second electrodes in the IGBT device 11 or 21, and the first electrodes and second electrodes in the diode device 21 or 22, are respectively connected to the common gate pads G1 and G2 within the device. The respective electrodes may be connected outside the devices. The phrase "first electrode and second electrode shared by the diode device" is understood to include electrodes connected outside the first device 10 or second device 20.

The first electrode 71 is formed so as to be shared by the switching device region and the diode device in the embodiments described above. Instead, the collector electrode in the IGBT device 11 or 21 and the cathode electrode in the diode device 21 or 22 may be formed as separate electrodes, i.e., "an electrode common to both devices" includes respective electrodes of the devices being connected to each other outside the first device 10 or second device 20.

The second electrode 78 is formed so as to be shared by the switching device region and the diode device in the embodiments described above. Instead, the emitter electrode in the IGBT device 11 or 21 and the anode electrode in the diode device 21 or 22 may be formed as separate electrodes, i.e., "an electrode common to both devices" includes respective electrodes of the devices being connected to each other outside the first device 10 or second device 20.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A semiconductor device comprising:
   a reverse conducting switching device including a diode device and a switching device, which are arranged in parallel at a single semiconductor substrate;
   a driver configured to apply a gate voltage to a plurality of gate electrodes included in the reverse conducting switching device; and
   a mode determination unit configured to determine whether
      a forward conduction mode in which a current flows mainly in the switching device, or
      a reverse conduction mode in which the current flows mainly in the diode device is operated in the reverse conducting switching device,
   wherein the diode device includes
      a first impurity region having a first conduction type,
      a second impurity region having a second conduction type which is coupled to the first impurity region,
      a first electrode configured to electrically connected to the first impurity region, and
      a second electrode configured to electrically connected to the second impurity region,
   wherein an inverted layer is generated in the first impurity region in response to applying a predetermined gate voltage to the plurality of gate electrodes, and
   wherein the switching device and the diode device commonly share the first electrode and the second electrode, respectively,
   wherein the switching device is turned on to control a current flow between the first electrode and the second electrode in response to applying the predetermined gate voltage to the plurality of gate electrodes,
   wherein the plurality of gate electrodes includes
      a first gate electrode to which a first gate voltage for turning on the switching device is input, and
      a second gate electrode to which a second gate voltage is input, the second gate voltage being controlled independently of the first gate voltage, the second gate voltage having a potential level same as a potential level at the second electrode or the second gate voltage having a polarity opposite from a polarity of the first gate voltage with reference to the potential level at the second electrode,
   wherein one part of the plurality of gate electrodes in the diode device includes at least the second gate electrode, and another part of the plurality of gate electrodes in the switching device includes at least the first gate electrode, and
   wherein the second gate voltage is applied to the second gate electrode
      in response to determining the reverse conducting switching device being operated in the reverse conduction mode based on the current flowing between the first electrode and the second electrode, or
      in response to the mode determination unit being unable to determine whether the reverse conduction mode or the forward conduction mode is operated in the reverse conducting switching device.

2. The semiconductor device according to claim 1, wherein the driver is configured to apply a PWM-controlled gate voltage including at least two respective values of a high voltage level and a low voltage level to the second gate electrode
   in response to determining the reverse conducting switching device being operated in the reverse conduction mode, or
   in response to the mode determination unit being unable to determine whether the reverse conduction mode or the forward conduction mode is operated in the reverse conducting switching device,
   wherein the low voltage level has a polarity opposite from the polarity of the first gate voltage with reference to the potential level at the second electrode.

3. The semiconductor device according to claim 1, wherein the driver is configured to apply, to the second gate electrode, a gate voltage having a polarity opposite from the polarity of the first gate voltage with reference to the potential level at the second electrode
   in response to determining the reverse conducting switching device being operated in the reverse conduction mode, or
   in response to the mode determination unit being unable to determine whether the reverse conduction mode or the forward conduction mode is operated in the reverse conducting switching device.

4. The semiconductor device according to claim 1, wherein, in response to determining the reverse conducting switching device being operated in the reverse conduction mode, the driver is configured to
   apply a gate voltage, which is equal to the potential level at the second electrode, to the second gate electrode when a diode current flowing between the first electrode and the second electrode is equal to or larger than a predetermined threshold, and
   apply a gate voltage having a polarity opposite from the polarity of the first gate voltage with reference to the potential level at the second electrode to the second gate electrode when the diode current is smaller than the predetermined threshold.

5. The semiconductor device according to claim 1, wherein a gate voltage having a polarity, which is opposite from the polarity of the first gate voltage with reference to the potential level at the second electrode, is applied to the plurality of gate electrodes in a combined region, which is a boundary region between a region where the diode device is arranged and a region where the switching device is arranged.

6. The semiconductor device according to claim 1, wherein the first gate voltage is applied to the plurality of gate electrodes in a combined region, which is a boundary region between a region where the diode device is arranged and a region where the switching device is arranged.

7. The semiconductor device according to claim 1, wherein the one part of the plurality of gate electrodes in the switching device includes the second gate electrode.

8. The semiconductor device according to claim 1, wherein a gate voltage applied to the first gate electrode by the driver is equal to the potential level at the second electrode in response to determining the reverse conducting switching device being operated in the reverse conduction mode.

9. The semiconductor device according to claim 1,
wherein the first impurity region at the diode device includes a barrier region having the first conduction type, which is adjacent to the second impurity region, and
wherein the inverted layer is generated at the barrier region in response to applying the predetermined gate voltage to the plurality of gate electrodes.

10. The semiconductor device according to claim 1,
wherein the diode device further includes a third impurity region having the second conduction type in a current path between the first electrode and the second electrode, the third impurity region arranged to be at the first impurity region and arranged to be isolated from the second impurity region.

* * * * *